(12) United States Patent
Chong et al.

(10) Patent No.: US 11,087,834 B2
(45) Date of Patent: Aug. 10, 2021

(54) READ AND WRITE TECHNIQUES

(71) Applicant: Arm Limited, Cambridge (GB)

(72) Inventors: Yew Keong Chong, Austin, TX (US);
Sriram Thyagarajan, Austin, TX (US);
Andy Wangkun Chen, Austin, TX (US);
Pratik Ghanshambhai Satasia, Cedar Park, TX (US)

(73) Assignee: Arm Limited, Cambridge (GB)

( * ) Notice: Subject to any disclaimer, the term of this patent is extended or adjusted under 35 U.S.C. 154(b) by 29 days.

(21) Appl. No.: 16/555,899

(22) Filed: Aug. 29, 2019

(65) Prior Publication Data
US 2021/0065785 A1 Mar. 4, 2021

(51) Int. Cl.
*G11C 11/00* (2006.01)
*G11C 11/419* (2006.01)
*H03K 5/24* (2006.01)
*G11C 11/418* (2006.01)

(52) U.S. Cl.
CPC .......... *G11C 11/419* (2013.01); *G11C 11/418* (2013.01); *H03K 5/2472* (2013.01)

(58) Field of Classification Search
CPC ............................ G11C 11/419; G11C 11/418
See application file for complete search history.

(56) References Cited

U.S. PATENT DOCUMENTS

| | | | | |
|---|---|---|---|---|
| 5,023,838 A | * | 6/1991 | Herbert | G09G 5/393 326/104 |
| 5,677,864 A | * | 10/1997 | Chung | G06F 9/3879 365/230.03 |
| 7,149,139 B1 | * | 12/2006 | Rosen | G06F 5/16 365/221 |
| 2018/0166128 A1 | * | 6/2018 | Rawat | G11C 11/418 |

* cited by examiner

*Primary Examiner* — Toan K Le
(74) *Attorney, Agent, or Firm* — Pramudji Law Group PLLC; Ari Pramudji (57) ABSTRACT

Various implementations described herein are directed to a device having various circuitry for reading first data from a memory location in single-port memory and writing second data to the memory location in the single-port memory after reading the first data from the memory location. In some implementations, reading the first data and writing the second data to the memory location are performed in a single operation.

20 Claims, 9 Drawing Sheets

READ AND WRITE TECHNIQUES

BACKGROUND

This section is intended to provide information relevant to understanding the various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

In conventional circuits, read and write operations are typically two independent operations. After each read or write operation completes, some internal nodes typically return to a reset state before start of the next cycle. Even if the address is the same, the wordline signal and other signals (e.g., precharge) may toggle twice for two independent memory accesses that are associated with read and write operations. Also, if the memory writes the same data as read in a previous read operation, bitlines may still need to be precharged and discharged. As such, in this instance, there is a timing and power penalty for resetting the internal nodes at the end of a cycle. Thus, there exists a need to improve physical design implementation of read and write circuitry to thereby improve performance of memory access operations associated with read and write operations.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein are directed to memory circuitry that may be configured for incorporating eviction-allocation (EVA) methodologies and features to improve performance. Various schemes and techniques described herein provide for a new memory feature circuit that allows for read and write at the same address in a single memory access operation in 1.5 timing cycles. Apart from performance improvement with fewer access cycles, there may be dynamic power benefit by not needing to re-decode the address and not needing to precharge one or more or all the bitlines at the end of the read cycle. There may also be leakage power benefit because the same amount of work may be achieved in fewer cycles, and as such, more cycles may be performed in power-saving modes. Generally, in reference to write allocation caches, eviction-allocation costs two memory access operations at the same index. In this instance, the eviction-allocation may complete the read and write operations in 1 to 1.5 memory access cycle. Even though latency for a single memory cycle may be degraded, the eviction-allocation technique may still meet the memory cycle time needed for L2 Cache, where memory access is typically every 2 to 3 memory cycles. Thus, overall number of cycles spent performing eviction will be halved, and this will improve timing and power for L2 Cache. Another idea is that the memory design may be improved to save more power by knowing that this is an eviction operation, and the same index is used for a combined read-write operation.

Various implementations of read and write schemes and techniques will now be described in detail herein with reference to FIGS. 1A-8.

Figure 1A:
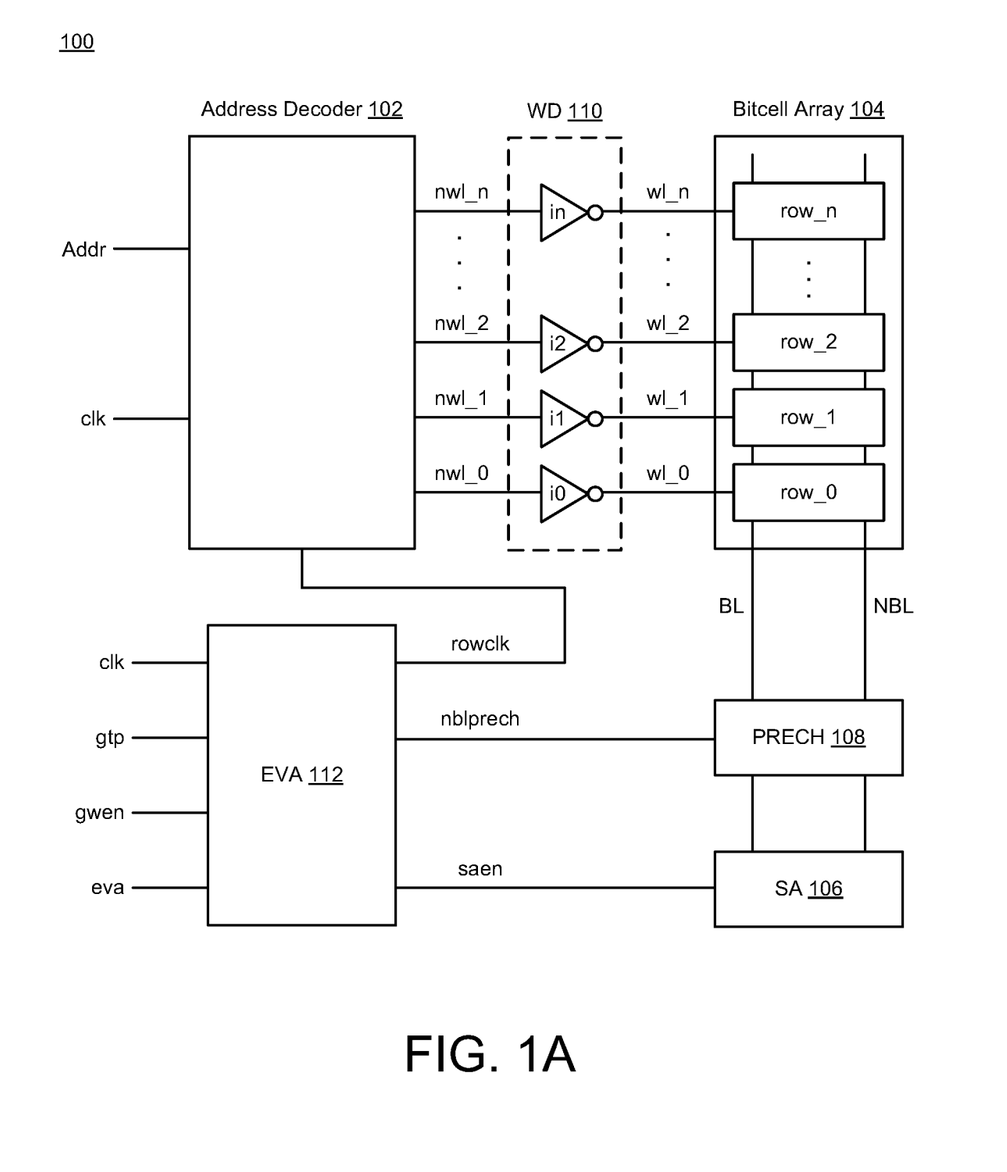
FIGS. 1A-1B illustrate various diagrams of memory circuitry in accordance with implementations described herein.
Figure 1B:
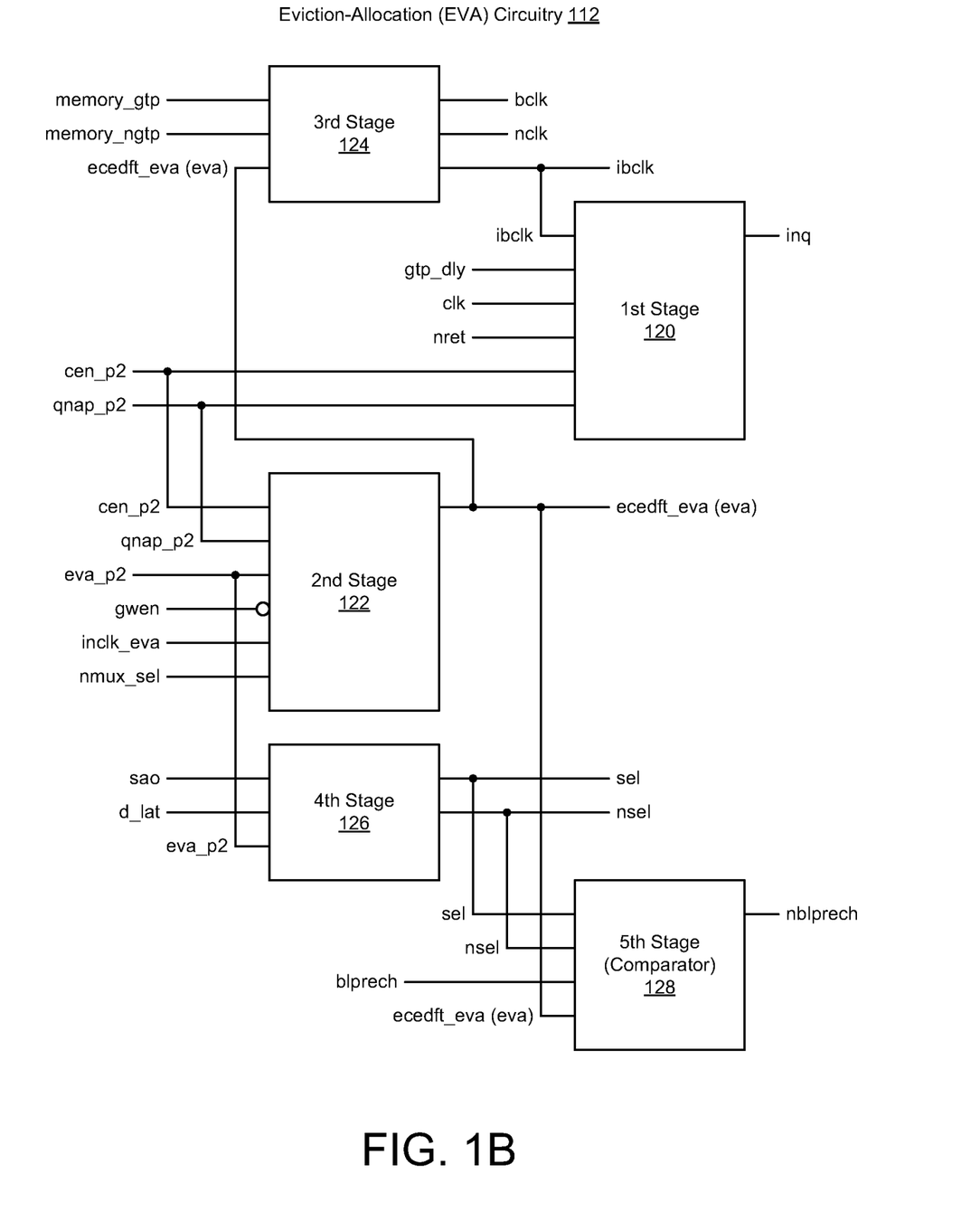

FIGS. 1A-1B illustrate diagrams of memory circuitry 100 in accordance with various implementations described herein. In particular, FIG. 1A illustrates the memory circuitry 100 with eviction-allocation (EVA) circuitry 112 and FIG. 1B illustrates the eviction-allocation (EVA) circuitry 112 as multi-stage EVA circuitry. In some instances, the memory circuitry 100 and/or the EVA circuitry 112 may be implemented as a system or a device having various circuit components that are arranged and coupled together as an assemblage or a combination of parts that provide for a physical circuit design and related structures. Also, in other instances, a method of designing, providing and building the memory circuitry 100 and/or the EVA circuitry 112 may involve use of various circuit components described herein so as to thereby implement read and write schemes and techniques associated therewith.

As shown in FIG. 1A, the memory circuitry 100 may include various circuitry including, e.g., an address decoder 102, a bitcell array 104, sense amplifier (SA) circuitry 106, bitline precharge (PRECH) circuitry 108, wordline driver (WLD) circuitry 110 and the eviction-allocation (EVA) circuitry 112. The memory circuitry 100 may include the bitcell array 104 having multiple rows of bitcells row_0, row_1, row_2, . . . , row_n. The sense amplifier circuitry 106 may be coupled to each of the bitcells in each of the rows of bitcells row_0, row_1, row_2, . . . , row_n via complementary bitlines (BL, NBL). Also, the memory circuitry 100 may include a number of inverted wordlines (e.g., nwl_0, nwl_1, nwl_2, . . . , nwl_n) that are coupled between the address decoder 102 and corresponding rows of bitcells row_0, row_1, row_2, . . . , row_n for access to each of the bitcells based on a selected wordline. Each of the inverted wordlines nwl_0, nwl_1, nwl_2, . . . , nwl_n has a corresponding wordline driver (e.g., inverters i0, i1, i2, . . . , in) coupled thereto to provide wordlines signals (e.g., wl_0, wl_1, wl_2, . . . , wl_n) to the corresponding rows of bitcells row_0, row_1, row_2, . . . , row_n. In some instances, the WLD circuitry 110 may include the wordline drivers (e.g., the inverters i0, i1, i2, . . . , in).

The memory circuitry 100 may receive multiple input signals, including, e.g., a clock signal (clk), a global timing pulse (gtp) signal, a global write enable (gwen) signal, an eviction-allocation (eva) signal and an address signal (Addr). The EVA circuitry 112 may receive the multiple input signals (clk, gtp, gwen, eva) and provide one or more output signals, such as, e.g., a row clock signal (rowclk), a sense amplifier enable signal (saen), and an nbl bitline precharge signal (nblprech). The address decoder 102 may receive multiple input signals including, e.g., the address signal (Addr) and the clock signal (clk), and the address decoder 102 may then access at least one inverted wordline (e.g., nwl_0, nwl_1, nwl_2, . . . , nwl_n) based on the received address signal (Addr), the clock signal (clk), and the row clock signal (rowclk).

In some instances, the address decoder 102 may receive the rowclk signal from the EVA circuitry 112 to assist with write operations, the SA circuitry 106 may receive the saen signal from the EVA circuitry 112 to assist with read operations, and the PRECH circuitry 108 may receive the nblprech signal from the EVA circuitry 112 for performing bitline precharge operations of the bitlines (BL, NBL).

In some implementations, the EVA circuitry 112 may include circuitry (e.g., one or more stages) that may be arranged and configured to evict first data from a memory location (or memory address) in single-port memory so as to allow for allocation of second data to the memory location. The EVA circuitry 112 may also include circuitry (e.g., one or more stages) that may be arranged and configured to write the second data to the memory location (or memory address) in the single-port memory after eviction of the first data from the memory location. In addition, the EVA circuitry 112 may include comparator circuitry that may be arranged and configured to suppress double-pump precharge of the bitlines (e.g., BL, NBL) that are related to the memory location (or memory address) when the first data matches the second data.

In some instances, evicting the first data from the memory location and writing the second data to the memory location are performed in a single operation. The single operation may refer to a single memory access operation, and evicting the first data from the memory location may include reading the first data from memory location followed by writing the second data to the memory location which are performed in the single memory access operation. The single operation may refer to an eviction-allocation operation that is performed in less time than separate read and write operations. The first data may refer to current data stored in the memory location, and the second data may refer impending data to be stored in the memory location. The memory location (or memory address) may refer to the same memory address, and also, the memory location (or memory address) may refer to a static random access memory (SRAM) instance.

The memory circuitry 100 may be implemented as an integrated circuit (IC) in various types of memory, such as, e.g., random access memory (RAM), including static RAM (SRAM), magneto-resistive RAM (MRAM), and/or any similar memory. The memory circuitry 100 may also be implemented as an IC with single-port memory architecture and related circuitry. The memory circuitry 100 may also be integrated with computing circuitry and related components on a single chip. The memory circuitry 100 may be implemented in various embedded systems for various electronic, mobile and Internet-of-things (IoT) applications, including low power sensor nodes.

The memory circuitry 100 includes the bitcell array 104 having multiple memory cells arranged in an array, wherein each memory cell may be referred to as a bitcell. Also, each memory cell may be configured to store at least one data bit value (e.g., a data value related to a logical '0' or '1'). The array of memory cells may include any number (N) of memory cells (or bitcells) arranged in various applicable configurations, such as, e.g., a two-dimensional (2D) memory array having any number of columns (Ncolumns) and any number of rows (Nrows) with memory cells arranged in a 2D grid pattern with associated indexing capabilities.

In reference to FIG. 1B, the EVA circuitry 112 may be implemented as multi-stage EVA circuitry. For instance, the multi-stage EVA circuitry 112 may include multiple stages, including, e.g., a first stage 120, a second stage 122, a third stage 124, a fourth stage 126 and a fifth stage 128. In some instances, one or more of the stages (e.g., 102, 122, 124, 126, 128) may be arranged and configured to provide one or more first signals that are used for reading first data from a memory location (or memory address) in single-port memory. Also, in some instances, one or more of the stages (e.g., 102, 122, 124, 126, 128) may be arranged and configured to provide one or more second signals that are used for writing second data to the memory location (or memory address) in the single-port memory after the first data is read from the memory location. The one or more first signals and the one or more second signals may allow for reading the first data and writing the second data in a single operation. In various implementations, the single operation may refer to a single memory access operation, and also, reading the first data from the memory location (or memory address) followed by writing the second data to the memory location may be performed in the single memory access operation. As such, the single operation may refer to an eviction-allocation (EVA) operation that is performed in less time than separate read and write operations.

In some instances, as shown in FIG. 1B, the first stage 120 may receive one or more signals, such as e.g., a delayed global timing pulse (gtp_dly), a clock signal (clk), a retention signal (nret), an enable signal (cen_p2), and a Q signal (qnap_p2). Also, the first stage 120 may be coupled to the third stage 124 so as to receive a clock signal (ibclk) therefrom. Based on receiving one or more of these input signals, the first stage 120 may provide an output signal (inq). In addition, the second stage 122 may receive one or more signals, such as, e.g., eva signals (eva_p2), a global write enable signal (gwen), a clocked eva signal (inclk_eva), a multiplexer signal (nmux_sel), the enable signal (cen_p2), and the Q signal (qnap_p2). The gwen signal may be received at an inverting input terminal of the second stage 122. Also, based on receiving one or more of these input signals, the second stage 120 may provide an eva output signal (ecedft_eva).

In some instances, the third stage 124 may receive one or more signals, such as, e.g., complementary memory gtp timing signals (memory_gtp, memory_ngtp), and the third stage 124 may also receive the eva output signal (ecedft_eva) from the second stage 122. Also, based on receiving one or more of these input signals, the third stage 124 may provide one or more output clock signals (e.g., bclk, nclk, iblck). In addition, the fourth stage 126 may receive one or more signals, such as, e.g., a sense amplifier signal (sao), a data latch signal (d_lat), and the eva signal (eva_p2). Based on receiving one or more of these input signals, the fourth stage 126 may provide one or more complementary output select signals (e.g., sel, nsel). Further, the fifth stage 128 may receive one or more signals, such as, e.g., the one or more complementary output select signals (e.g., sel, nsel) from the fourth stage 126, a bitline precharge signal (blprech), and the eva output signal (ecedft_eva) from the second stage 122. In some implementations, the fifth stage 128 may be configured to operate and function as a comparator.

In various implementations, any number of the input/output signals may refer to the first input signals and/or the second signals that may be used for performing read and write operations of the EVA schemes and techniques described herein. For instance, any number of the input/output signals described herein may be used for reading first data from a memory location in single-port memory and for writing second data to the memory location in the single-port memory after the first data is read from the memory location. In addition, one or more first signals and the one or more second signals allow for reading the first data and writing the second data in a single operation. In some instances, one or more first signals or one or more second signals may be used for evicting the first data from the memory location in the single-port memory so as to provide for allocation of the second data to the memory location, and also, writing the second data to the memory location in the single-port memory may be performed after evicting the first data from the memory location. The first data may refer to current data that is stored in the memory location (or memory address), and also, the second data may refer to impending data to be stored in the memory location (or memory address).

Figure 2:
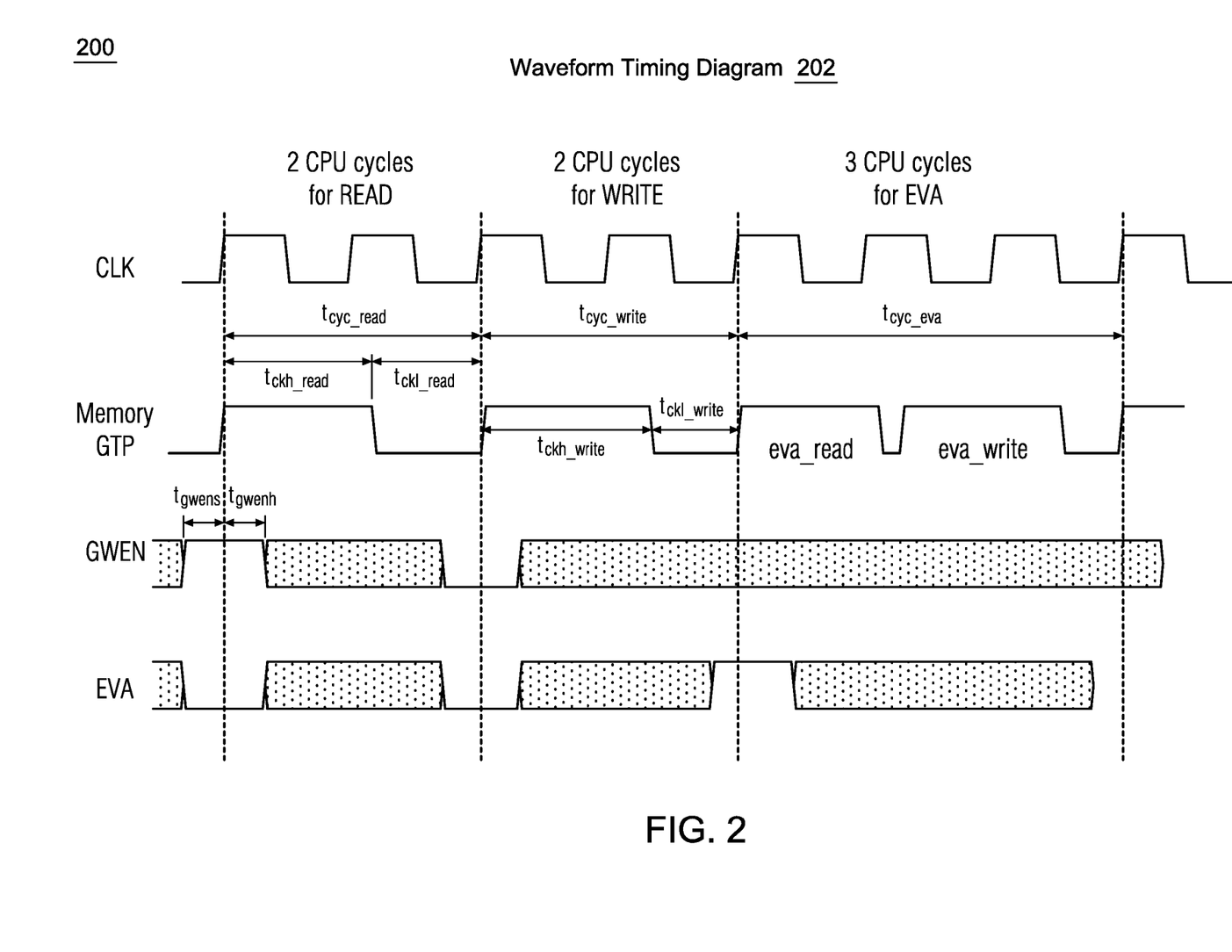
FIG. 2 illustrates a waveform timing diagram in accordance with various implementations described herein.

FIG. 2 illustrates a waveform timing diagram 200 in accordance with various implementations described herein. In particular, the waveform timing diagram 200 shows timing cycles for a normal read operation (READ), a normal write operation (WRITE), and an eviction-allocation (EVA) operation.

In some instances, as shown in FIG. 2, a normal read operation (READ) may be performed in multiple timing cycles (e.g., 2 CPU cycles), and a normal write operation (WRITE) may be performed in multiple timing cycles (e.g., 2 CPU cycles). In this instance, a normal read operation (tcyc_read) followed by a normal write operation (tcyc_write) may refer to 4 CPU cycles. In contrast, an eviction-allocation (EVA) operation (tcyc_eva) may be performed in a fewer number of cycles (e.g., <4 cycles, such as 3 CPU cycles) than a normal read operation followed by a normal write operation. Thus, in this instance, the combined eva operation of an eva_read and an eva write may be performed faster and in less time than the normal read operation followed by the normal write operation.

In some implementations, the EVA techniques and features described herein provide for a read/write cycle, wherein the memory performs a read operation followed by a write operation to the same address. The address decoding may be completed once in the beginning of a cycle, and the resulting decoded wordline may be used for both read and write operations. In this instance, GTP may toggle twice (i.e., once for read followed by once for write), and depending on whether the EVA operation is performed or not, the latch-clocks (BCLK/NCLK) that are generated using GTP may toggle twice or just once only (e.g., when EVA=1). Only the GWEN/QNAP latches are not controlled this way, and these latches may follow GTP (i.e., DGTP/DNGTP). The wordline may also toggle twice following the GTP, and if EVA=1, a new GWEN may be generated internally and fed to the GWEN-latch, which makes sure that the read operation is performed in the first gtp pulse, and then the write operation is performed in the next gtp pulse. Also, if EVA=0, the internal-GWEN may follow the external GWEN-input, and the first wordline pulse may trigger the read operation along with the NYR/SAE.

In some implementations, depending on the read-data of the bitcell, data may be sensed from the BL/NBL through the sense amplifier (SAO/Q), and a comparison may be performed with new data to be written-next (latched D-input) in each column-mux. If comparison provides a "same" data match (sao versus d_lat), then the new data (which is the same) may not be written into the same bitcell. Also, the precharge operation may be off until the end of the write-cycle, and in this instance, there may be no toggling of the bitlines (BL/NBL) to save dynamic power. Otherwise, if comparison says "different" data does not match (sao versus d_lat), the new data (which is different) may be written into the bitcell. The precharge may follow the GTP and pulse twice, and in this instance, either NBL pulse in the first-pump with BL staying high and BL pulse in the second-pump with NBL staying high is expected, or vice-versa. This may cause dynamic power on one or more or all the selected and unselected (dummy-read) bitlines for that particular column-mux. When EVA=1, the write operation may start immediately after the read operation, and this may improve overall timing. In some instances, half of the bits of a data bus may be writing the same data as the previous read. When dynamic power is being consumed by constant precharging and discharging bitlines, the EVA techniques described herein may save clock power for at least half of the bits. Also, in other instances, the EVA techniques may account for additional clock power savings.

Figure 3:
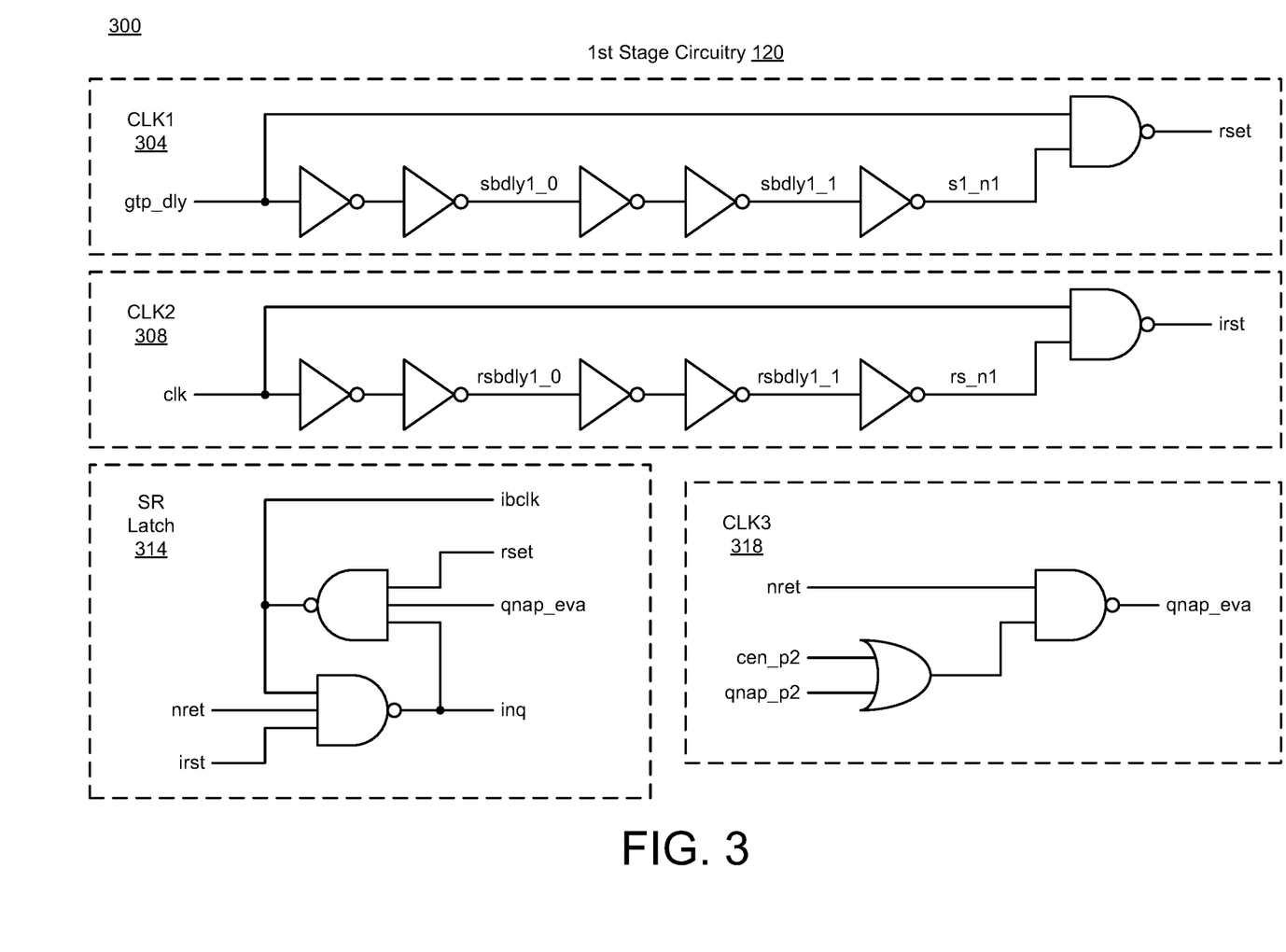
FIGS. 3-7 illustrate diagrams of eviction-allocation circuitry in accordance with implementations described herein.
Figure 4:
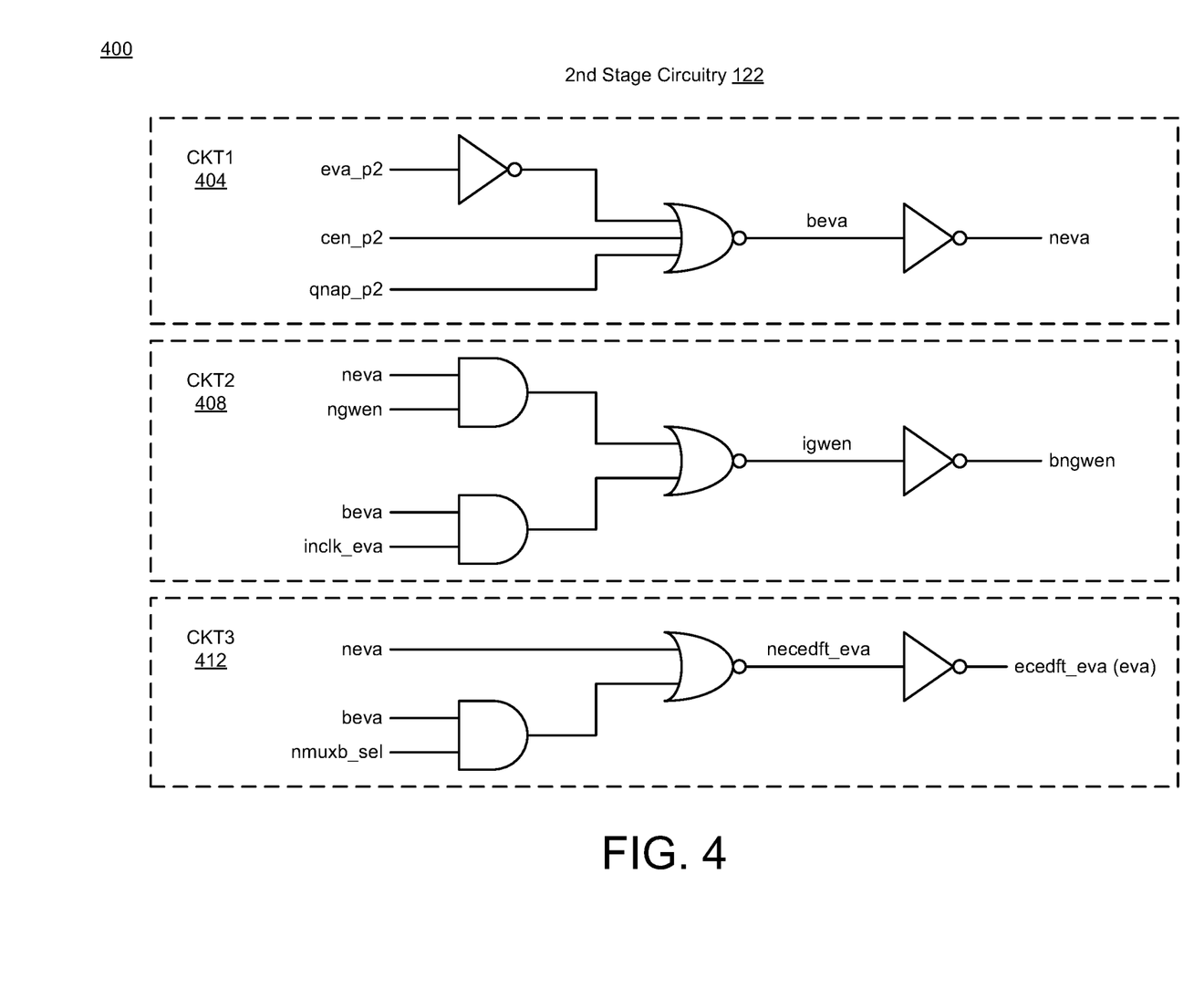
Figure 5:
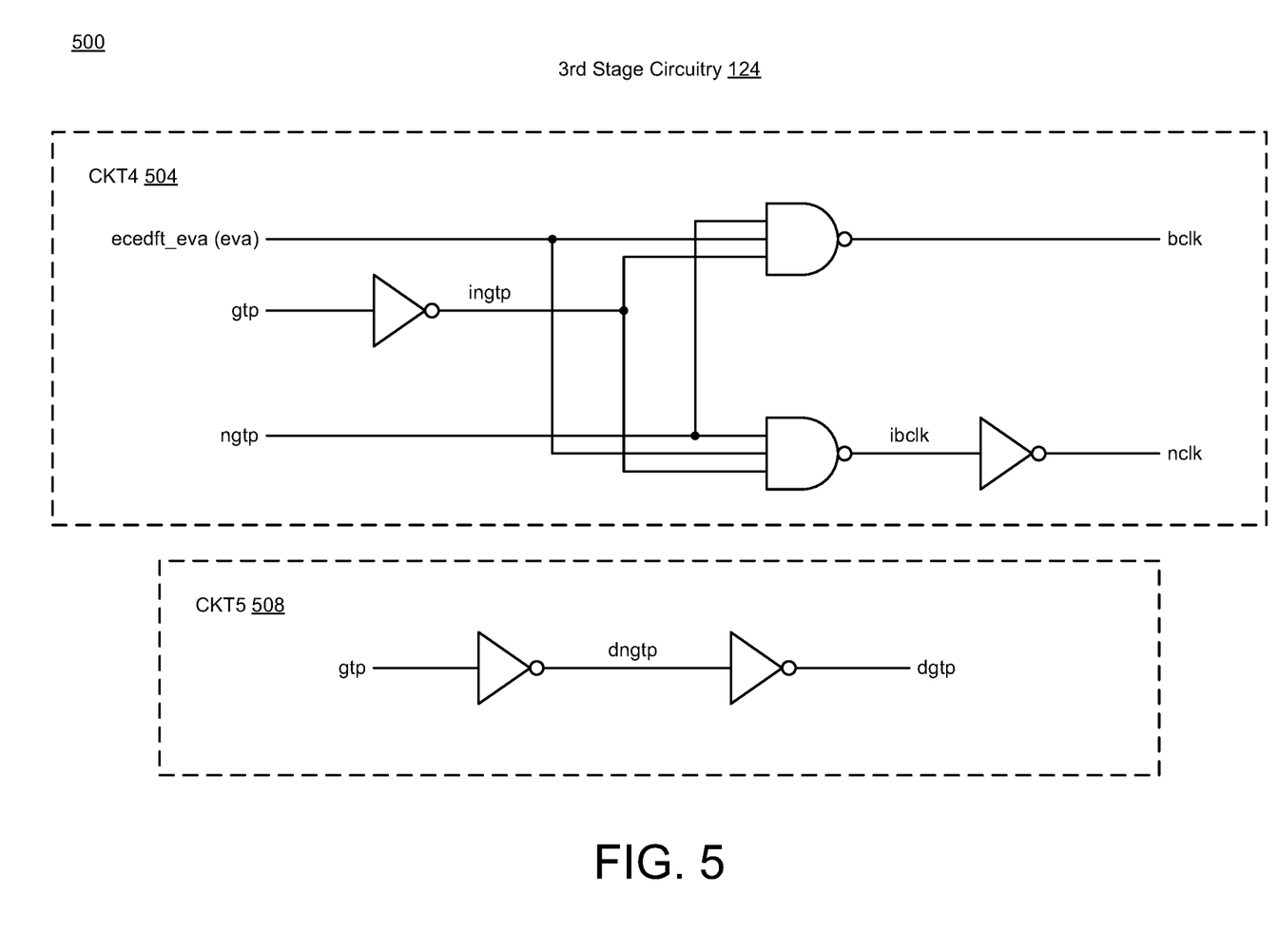
Figure 6:
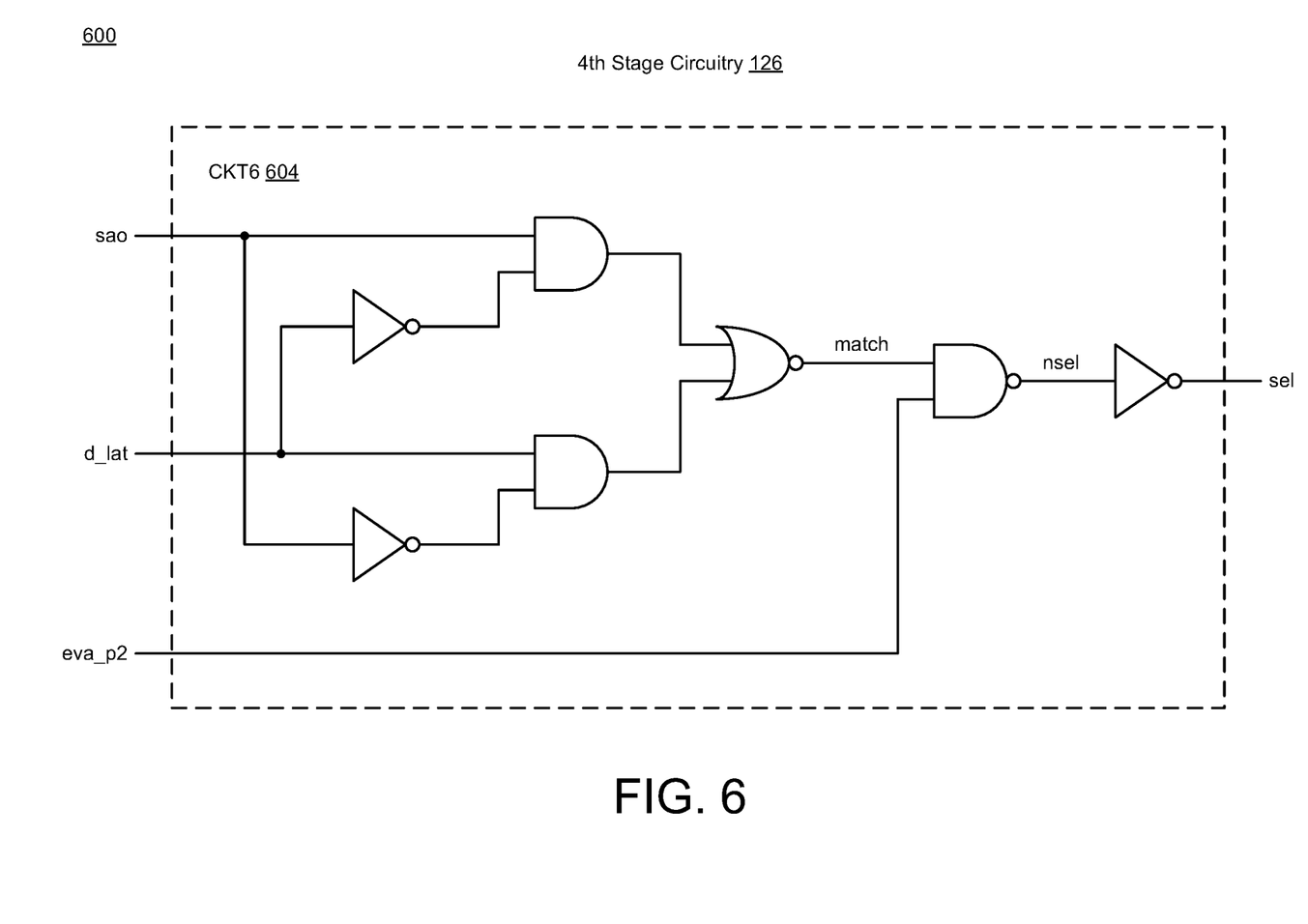
Figure 7:
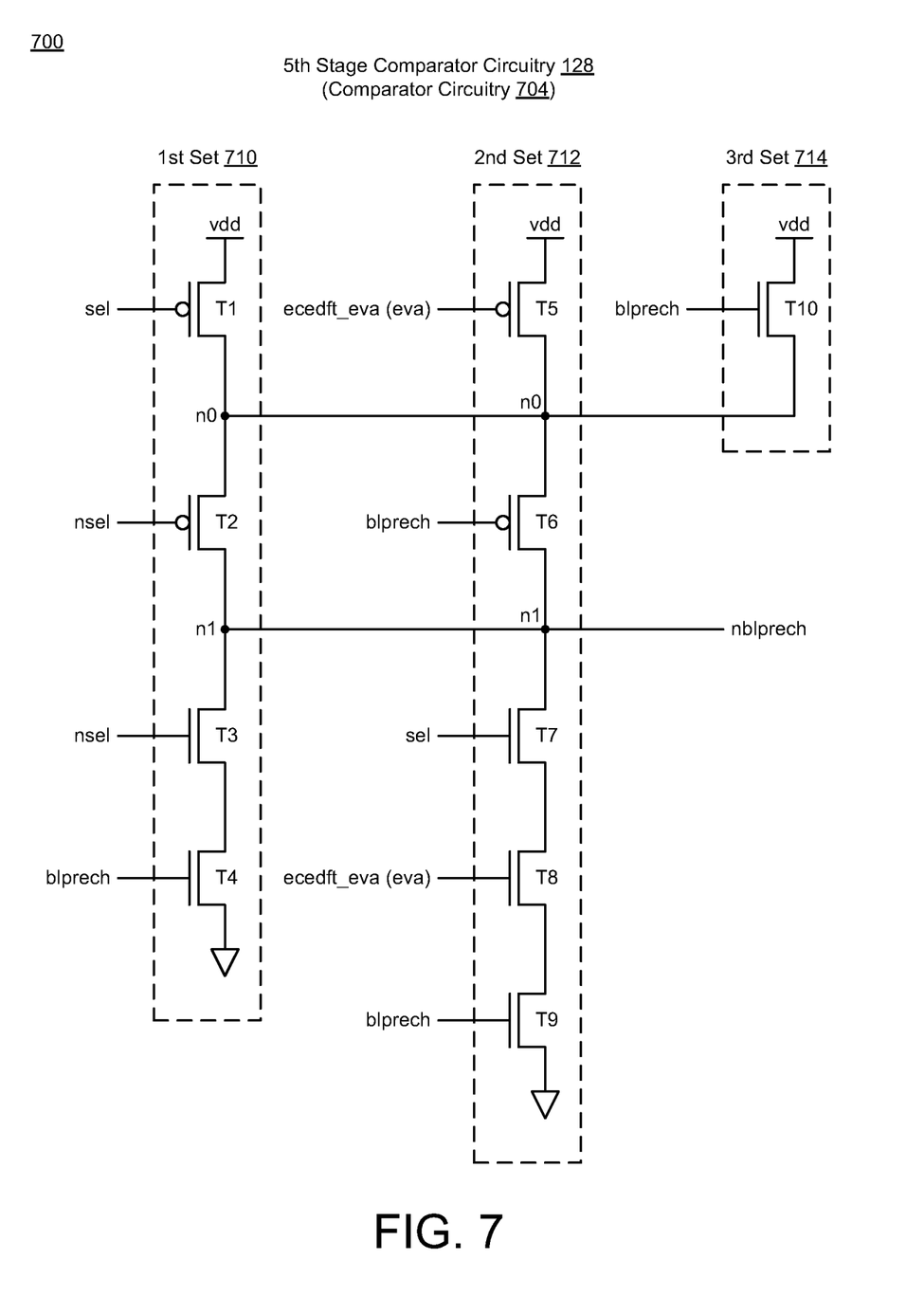

FIGS. 3-7 illustrate diagrams of eviction-allocation circuitry in accordance with implementations described herein. In particular, FIG. 3 shows a diagram 300 of the first stage circuitry 120, FIG. 4 shows a diagram 400 of the second stage circuitry 122, FIG. 5 shows a diagram 500 of the third stage circuitry 124, FIG. 6 shows a diagram 600 of the fourth stage circuitry 126, and FIG. 7 shows a diagram 700 of the fifth stage circuitry 128. In some instances, the multi-stage EVA circuitry 112 may be implemented as a system or a device having various circuit components shown in FIGS. 3-7 that are arranged and coupled together as an assemblage or a combination of parts that provide for a physical circuit design and related structures. Also, in other instances, a method of designing, providing and building the multi-stage EVA circuitry 112 may involve use of the various circuit components shown in FIGS. 3-7 so as to thereby implement read and write schemes and techniques associated therewith.

As shown in FIG. 3, the first stage circuitry 120 may include various circuits, such as, e.g., CLK1 (304), CLK2 (308), SR latch (314), and CLK3 (318), that are arranged and configured to receive input signals and provide output signals. For instance, the CLK1 circuit (304) may include multiple inverters that are coupled in series to receive the gtp_dly signal and provide an intermediate signal (s1_n1), and the CLK1 circuit (304) may include a logic gate (e.g., NAND gate) that receives the gtp_dly signal, receives the s1_n1 signal, and provides a set signal (rset). The CLK2 circuit (308) may include multiple inverters that are coupled in series to receive the clk signal and provide an intermediate signal (rs_n1), and the CLK2 circuit (308) may include a logic gate (e.g., NAND gate) that receives the clk, receives the rs_n1 signal, and provides a reset signal (irst). The SR latch circuit (314) may include multiple logic gates (e.g., NAND gates) that are coupled together to receive multiple signals (nret, irst, rst, qnap_eva) and provide output signals (ibclk, inq), which may be used as feedback signals for input to the logic gates (e.g., NAND gates). The CLK3 circuit (318) may include multiple logic gates (e.g., NAND and OR gates) that are coupled together to receive multiple signals (nret, cen_p2, qnap_p2) and provide the eva output signal (qnap_eva). In some implementations, the first stage circuitry 120 may be configured as set-reset (SR) latch circuitry that may be used for generating the control signal (qnap_eva) for eva control.

As shown in FIG. 4, the second stage circuitry 122 may include various circuits, such as, e.g., CKT1 (404), CKT2 (408), and CKT3 (412), that are arranged and configured to receive input signals and provide output signals. For instance, the CKT1 circuit (404) may include multiple logic gates (e.g., one or more Inverters and NOR gates) that are coupled together to receive multiple signals (eva_p2, cen_p2, qnap_p2) and provide an eva output signal (neva). The CKT2 circuit (408) may include multiple logic gates (e.g., Inverter, AND and NOR gates) that are coupled together to receive multiple signals (neva, ngwen, beva, inclk_eva) and provide an output signal (bngwen). The CKT3 circuit (412) may include multiple logic gates (e.g., Inverter, AND and NOR gates) that are coupled together to receive multiple signals (neva, beva, nmuxb_sel) and provide an eva output signal (ecedft_eva). In some implementations, the second stage circuitry 122 may be used for generating the control signal (ecedft_eva) for eva control.

As shown in FIG. 5, the third stage circuitry 124 may include various circuits, such as, e.g., CKT4 (504) and CKT5 (508), that are arranged and configured to receive input signals and provide output signals. For instance, the CKT4 circuit (504) may include multiple logic gates (e.g., Inverters and NAND gates) that are coupled together to receive multiple signals (ecedft_eva, gtp, ngtp) and provide clock output signals (bclk, nclk). The CKT5 circuit (508) may include multiple logic gates (e.g., one or more inverter gates) that are coupled together to receive the global timing pulse signal (gtp) and provide a digital gtp output signal (dgtp). In some implementations, the third stage circuitry 124 may be configured as latch-clock logic that may be used to convert double-pulse signals to single-pulse signals for eva control.

As shown in FIG. 6, the fourth stage circuitry 126 may include at least one circuit, such as, e.g., CKT6 (604), that is arranged and configured to receive input signals and provide output signals. For instance, the CKT6 circuit (604) may include multiple logic gates (e.g., Inverters, AND, NOR and NAND gates) that are coupled together to receive multiple signals (sao, d_lat, eva_p2) and provide an output signals (sel).

As shown in FIG. 7, the fifth stage circuitry 128 may include at least one circuit, such as, e.g., comparator circuitry 704, that is arranged and configured to receive input signals and provide output signals. For instance, the comparator circuitry 704 may include multiple transistors (e.g., p-type and n-type transistors) that are coupled together to receive multiple signals (sel, nsel, blprech, ecedft_eva) and provide a bitline precharge output signal (nblprech). The comparator circuitry 704 includes multiple sets of transistors 710, 712, 714 that are coupled in parallel via nodes (n0, n1). For instance, the comparator circuitry 704 may include a first set of transistors (710: T1, T2, T3, T4) that is coupled in series between a source voltage supply (vdd) and ground (vss or gnd). The comparator circuitry 704 may include a second set of transistors (712: T5, T6, T7, T8, T9) that is coupled in series between the source voltage supply (vdd) and ground (vss or gnd). The comparator circuitry 704 may include a third set of transistors (714: T10) that is coupled between the source voltage supply (vdd) and ground (vss or gnd). Also, node (n1) may refer to an output node that provides the nblprech signal. In some implementations, the fourth and fifth stage circuitry 126, 128 may be configured as comparator logic circuitry that may be used in a column-tile to suppress double-pump precharging (nblprech) when data matches between read (sao) and new data to be written (d_lat).

Figure 8:
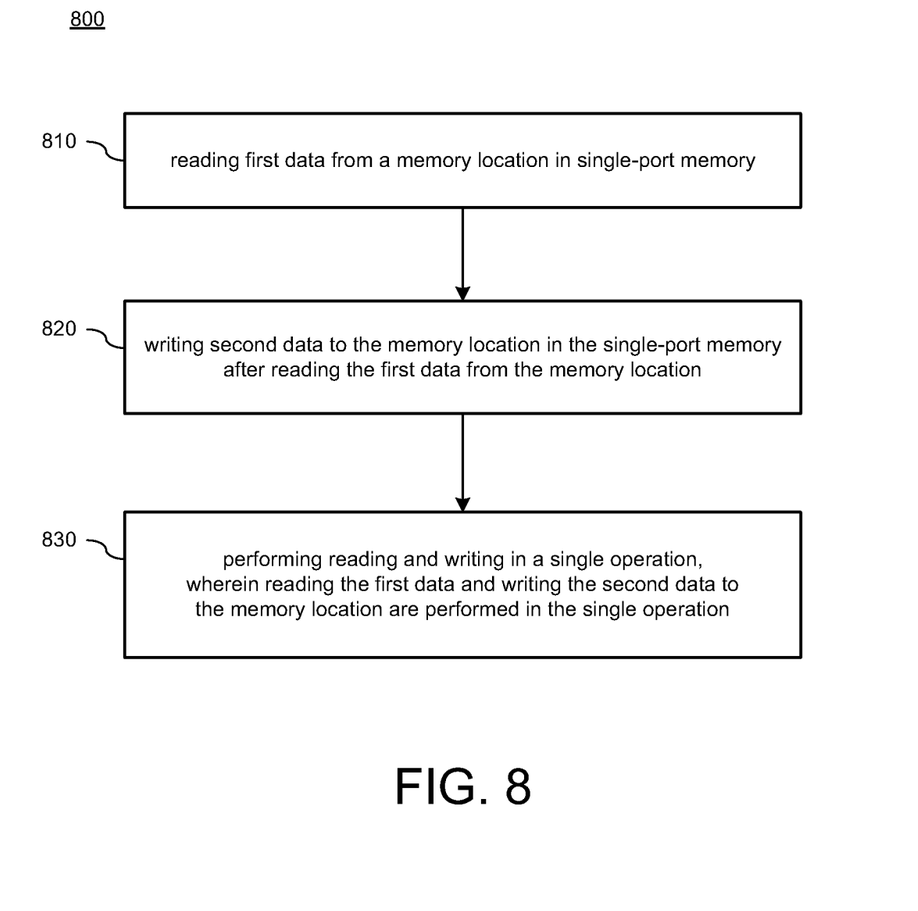
FIG. 8 illustrates a process diagram of a method for performing read and write operations in accordance with various implementations described herein.

FIG. 8 illustrates a process diagram of a method 800 for performing read and write operations in accordance with various implementations described herein. It should be understood that even though method 800 may indicate a particular order of execution of operations, in some instances, certain portions of the operations may be executed in a different order, and on different systems. In other instances, additional operations or steps may be added to and/or omitted from method 800.

At block 810, method 800 may read first data from a memory location in single-port memory. At block 820, method 800 may write second data to the memory location in the single-port memory after reading the first data from the memory location. The first data may include current data stored in the memory location, and the second data may include impending data to be stored in the memory location. The memory location may refer to the same memory address. In some instances, the memory location may refer to a static random access memory (SRAM) instance.

At block 830, method 800 may perform reading and writing in a single operation, wherein reading the first data and writing the second data to the memory location may be performed in the single operation. In some instances, the single operation may refer to a single memory access operation, and also, reading the first data from the memory location followed by writing the second data to the memory location are performed in the single memory access operation. The single operation may refer to an eviction-allocation (EVA) operation that is performed in less time than separate read and write operations.

In some implementations, method 800 may include evicting the first data from the memory location in the single-port memory so as to provide for allocation of the second data to the memory location. Also, writing the second data to the memory location in the single-port memory is performed after evicting the first data from the memory location.

Described herein are various implementations of a method. The method may include reading first data from a memory location in single-port memory. The method may include writing second data to the memory location in the single-port memory after reading the first data from the memory location. In some cases, reading the first data and writing the second data to the memory location are performed in a single operation.

Described herein are various implementations of a device. The device may include first circuitry that evicts first data from a memory location in single-port memory to allow for allocation of second data to the memory location. The device may include second circuitry that writes the second data to the memory location in the single-port memory after eviction of the first data from the memory location. The device may include comparator circuitry that suppresses double-pump precharge of bitlines related to the memory location when the first data matches the second data.

Described herein are various implementations of a circuit. The circuit may include a first stage that provides one or more first signals that are used for reading first data from a memory location in single-port memory. The circuit may include a second stage that provides one or more second signals that are used for writing second data to the memory location in the single-port memory after the first data is read from the memory location. The one or more first signals and the one or more second signals may allow for reading the first data and writing the second data in a single operation.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A method, comprising:
   reading first data from a memory location in single-port memory; and
   writing second data to the memory location in the single-port memory after reading the first data from the memory location,
   wherein reading the first data and writing the second data to the memory location are performed in a single operation,
   wherein the single operation refers to a single memory access operation comprising an eviction-allocation operation.

2. The method of claim 1, wherein reading the first data from the memory location followed by writing the second data to the memory location are performed in the single memory access operation.

3. The method of claim 1, wherein the eviction-allocation operation is performed in less time than separate read and write operations.

4. The method of claim 1, further comprising:
   evicting the first data from the memory location in the single-port memory so as to provide for allocation of the second data to the memory location,
   wherein writing the second data to the memory location in the single-port memory is performed after evicting the first data from the memory location.

5. The method of claim 1, wherein the first data comprises current data stored in the memory location, and wherein the second data comprises impending data to be stored in the memory location.

6. The method of claim 1, wherein the memory location refers to the same memory address.

7. The method of claim 1, wherein the memory location refers to a static random access memory (SRAM) instance.

8. A device, comprising:
   first circuitry that evicts first data from a memory location in single-port memory to allow for allocation of second data to the memory location;
   second circuitry that writes the second data to the memory location in the single-port memory after eviction of the first data from the memory location; and
   comparator circuitry that suppresses double-pump precharge of bitlines related to the memory location when the first data matches the second data.

9. The device of claim 8, wherein evicting the first data from the memory location and writing the second data to the memory location are performed in a single operation.

10. The device of claim 9, wherein the single operation refers to a single memory access operation, and wherein evicting the first data from the memory location includes reading the first data from memory location followed by writing the second data to the memory location which are performed in the single memory access operation.

11. The device of claim 10, wherein the single operation refers to an eviction-allocation operation that is performed in less time than separate read and write operations.

12. The device of claim 8, wherein the first data comprises current data stored in the memory location, and wherein the second data comprises impending data to be stored in the memory location.

13. The device of claim 8, wherein the memory location refers to the same memory address.

14. The device of claim 8, wherein the memory location refers to a static random access memory (SRAM) instance.

15. A circuit, comprising:
a first stage that provides one or more first signals that are used for reading first data from a memory location in single-port memory; and
a second stage that provides one or more second signals that are used for writing second data to the memory location in the single-port memory after the first data is read from the memory location,
wherein the one or more first signals and the one or more second signals allow for reading the first data and writing the second data in a single operation,
wherein the single operation refers to a single memory access operation comprising an eviction-allocation operation.

16. The circuit of claim 15, wherein reading the first data from the memory location followed by writing the second data to the memory location are performed in the single memory access operation.

17. The circuit of claim 15, wherein the eviction-allocation operation is performed in less time than separate read and write operations.

18. The circuit of claim 15, wherein:
the one or more first signals or the one or more second signals are used for evicting the first data from the memory location in the single-port memory so as to provide for allocation of the second data to the memory location, and
writing the second data to the memory location in the single-port memory is performed after evicting the first data from the memory location.

19. The circuit of claim 15, wherein the first data comprises current data stored in the memory location, and wherein the second data comprises impending data to be stored in the memory location.

20. The circuit of claim 15, wherein the memory location refers to the same memory address.

* * * * *